US012701797B2

(12) United States Patent
Frey et al.

(10) Patent No.: US 12,701,797 B2
(45) Date of Patent: Aug. 4, 2026

(54) METHOD OF THINNING A SEMICONDUCTOR SUBSTRATE TO HIGH EVENNESS AND SEMICONDUCTOR SUBSTRATE HAVING A DEVICE LAYER OF HIGH EVENNESS

(71) Applicant: Infineon Technologies AG, Neubiberg (DE)

(72) Inventors: Alexander Frey, Lappersdorf (DE); Bernhard Goller, Villach (AT); Iris Moder, Villach (AT); Ingo Muri, Villach (AT); Alfred Sigl, Sinzing (DE); Tobias Weindler, Teublitz (DE)

(73) Assignee: Infineon Technologies AG, Neubiberg (DE)

( * ) Notice: Subject to any disclaimer, the term of this patent is extended or adjusted under 35 U.S.C. 154(b) by 1089 days.

(21) Appl. No.: 17/345,534

(22) Filed: Jun. 11, 2021

(65) Prior Publication Data

US 2021/0391377 A1 Dec. 16, 2021

(30) Foreign Application Priority Data

Jun. 15, 2020 (EP) ..................................... 20179998

(51) Int. Cl.
*H10F 39/00* (2025.01)
*G01S 17/894* (2020.01)
(Continued)

(52) U.S. Cl.
CPC .......... *H10F 39/026* (2025.01); *G01S 17/894* (2020.01); *H10D 30/66* (2025.01);
(Continued)

(58) Field of Classification Search
CPC .............. H01L 29/06; H01L 21/02035; H01L 27/14687; H01L 27/14632;
(Continued)

(56) References Cited

U.S. PATENT DOCUMENTS 10,395,974 B1 * 8/2019 Chou ................ H01L 21/30604
2010/0295103 A1 11/2010 Ng et al.
(Continued)

FOREIGN PATENT DOCUMENTS

CN 109192741 A 1/2019
CN 110828367 A 2/2020

*Primary Examiner* — Jeff W Natalini
*Assistant Examiner* — Alexander Belousov
(74) *Attorney, Agent, or Firm* — Murphy, Bilak & Homiller, PLLC

(57) ABSTRACT

A method of manufacturing a semiconductor device is described. The method includes providing a semiconductor substrate. The semiconductor substrate includes a high-doped semiconductor substrate layer, a high-doped semiconductor device layer, and a low-doped semiconductor etch stop layer arranged between the high-doped semiconductor substrate layer and the high-doped semiconductor device layer. The high-doped semiconductor substrate layer is removed, wherein the removing includes dopant selective chemical etching stopping at the low-doped semiconductor etch stop layer. Further, the low-doped semiconductor etch stop layer is thinned to generate an exposed surface of the high-doped semiconductor device layer.

12 Claims, 11 Drawing Sheets

(51) Int. Cl.

| | |
|---|---|
| *H10D 30/66* | (2025.01) |
| *H10F 39/12* | (2025.01) |
| *H10F 39/18* | (2025.01) |
| *H10P 52/00* | (2026.01) |
| *H10W 46/00* | (2026.01) |

(52) U.S. Cl.
CPC ........... *H10F 39/024* (2025.01); *H10F 39/18*
(2025.01); *H10F 39/199* (2025.01); ***H10F
39/8057* (2025.01); *H10F 39/8063*** (2025.01);
*H10P 52/00* (2026.01); *H10W 46/00*
(2026.01); *H10W 46/301* (2026.01)

(58) Field of Classification Search
CPC ......... H01L 2223/54426; H01L 23/544; H01L
21/30604; H01L 21/304; H01L 21/02013;
H10F 39/026
See application file for complete search history.

(56) References Cited

U.S. PATENT DOCUMENTS

| | | | |
|---|---|---|---|
| 2018/0350660 A1* | 12/2018 | Tsai ................... | H01L 21/30604 |
| 2019/0206722 A1* | 7/2019 | De Silva ........... | H01L 21/76294 |
| 2020/0058746 A1* | 2/2020 | Wu .................... | H01L 21/76254 |
| 2021/0391377 A1* | 12/2021 | Frey ...................... | H01L 21/304 |

\* cited by examiner

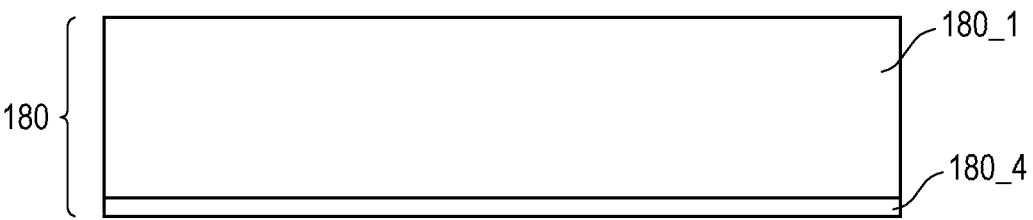
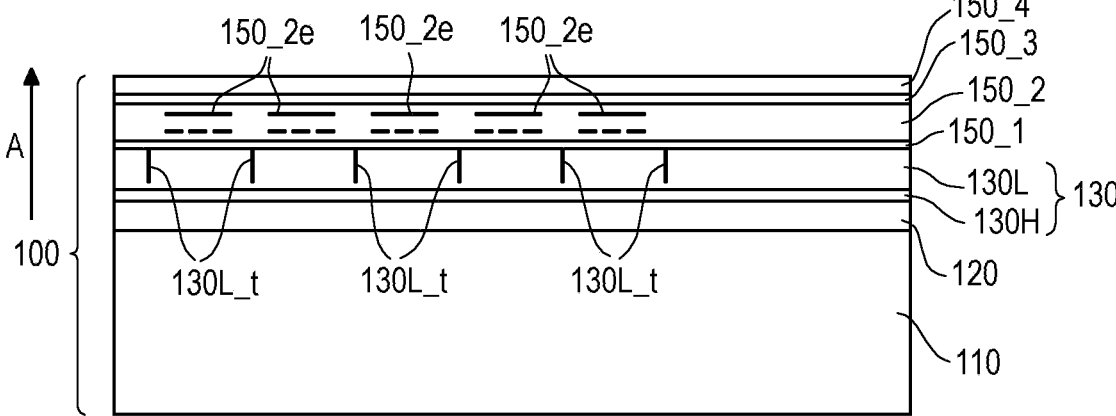
Fig. 1
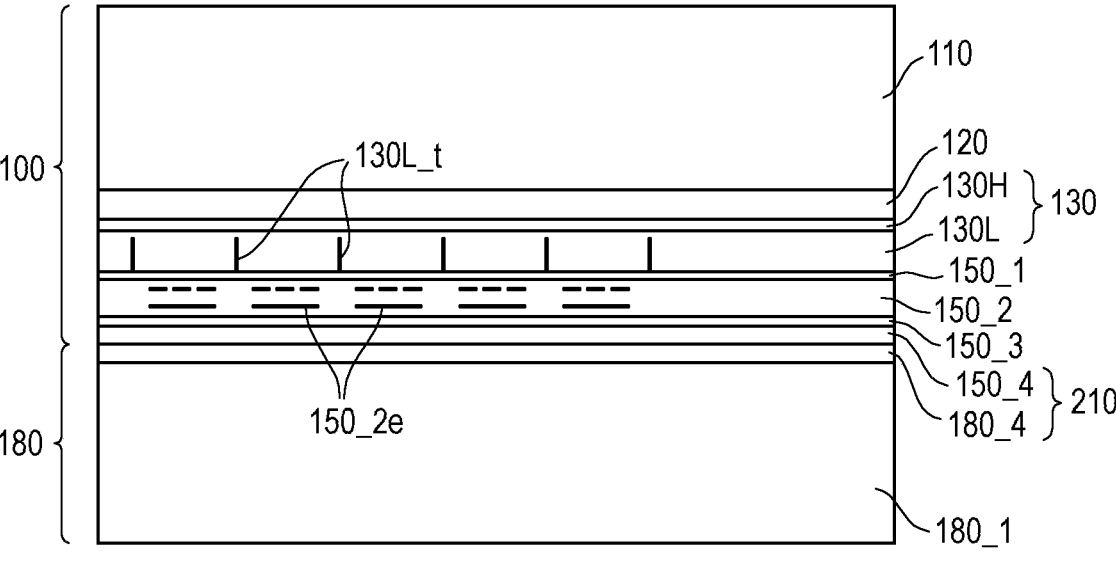
Fig. 2

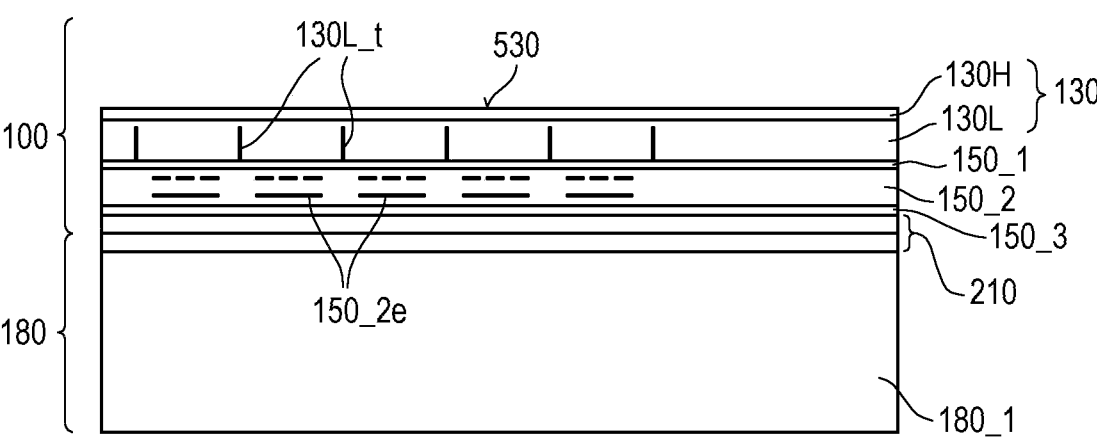

Fig. 5

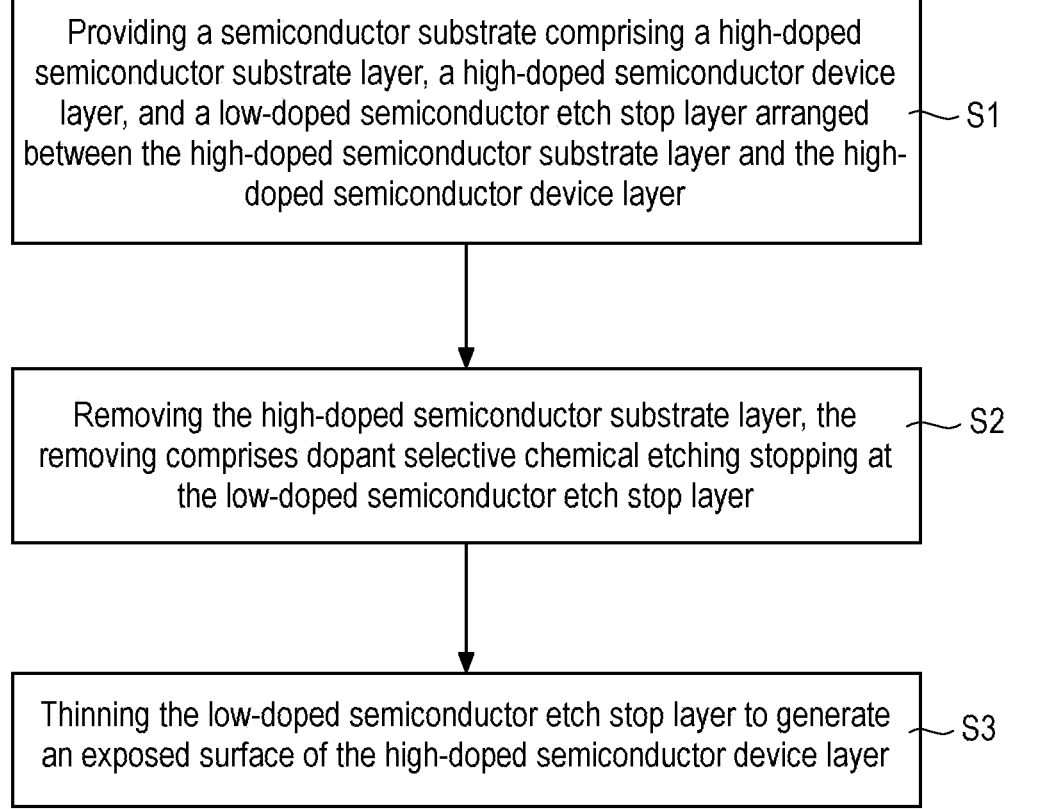

Providing a semiconductor substrate comprising a high-doped semiconductor substrate layer, a high-doped semiconductor device layer, and a low-doped semiconductor etch stop layer arranged between the high-doped semiconductor substrate layer and the high-doped semiconductor device layer —— S1

Removing the high-doped semiconductor substrate layer, the removing comprises dopant selective chemical etching stopping at the low-doped semiconductor etch stop layer —— S2

Thinning the low-doped semiconductor etch stop layer to generate an exposed surface of the high-doped semiconductor device layer —— S3

Fig. 6

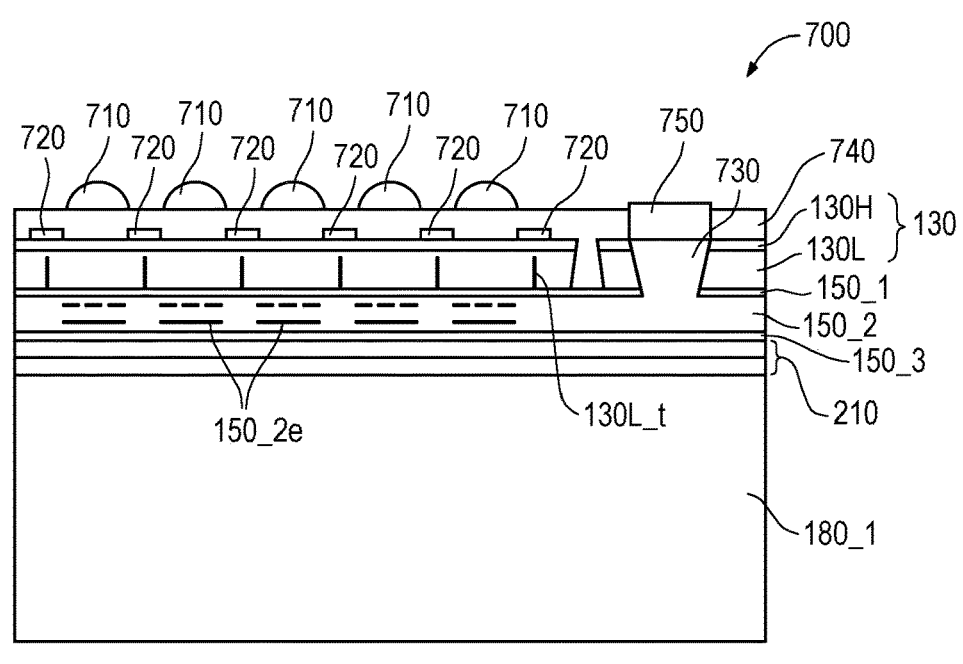
Fig. 7
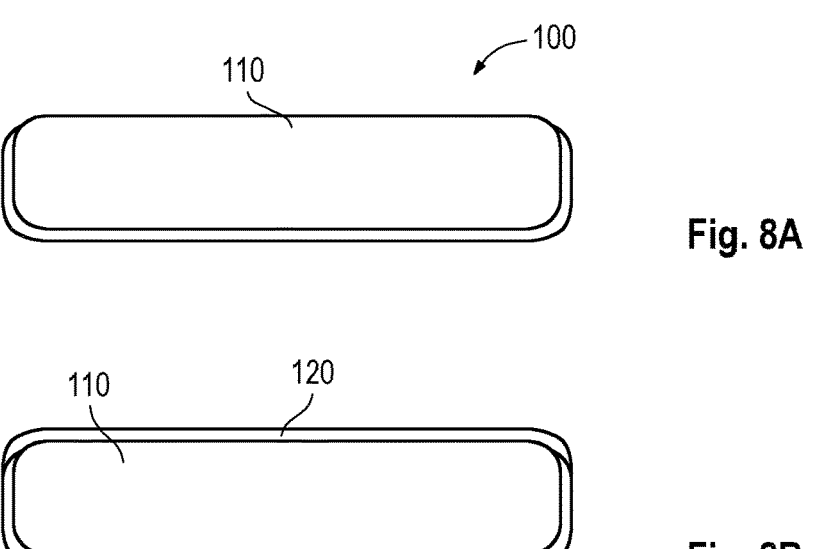
Fig. 8A
Fig. 8B
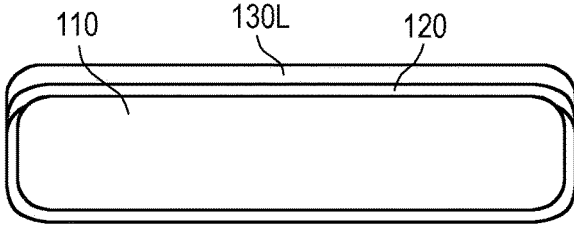
Fig. 8C

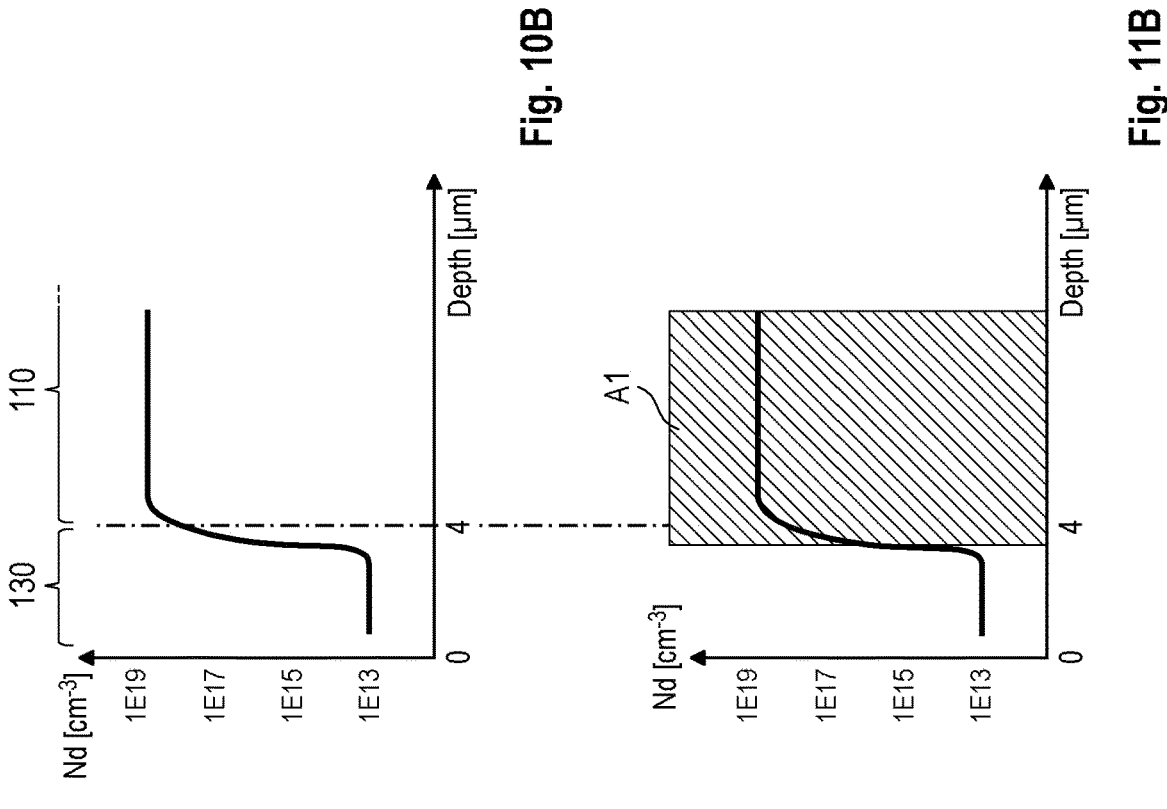
Fig. 10B
Fig. 10A
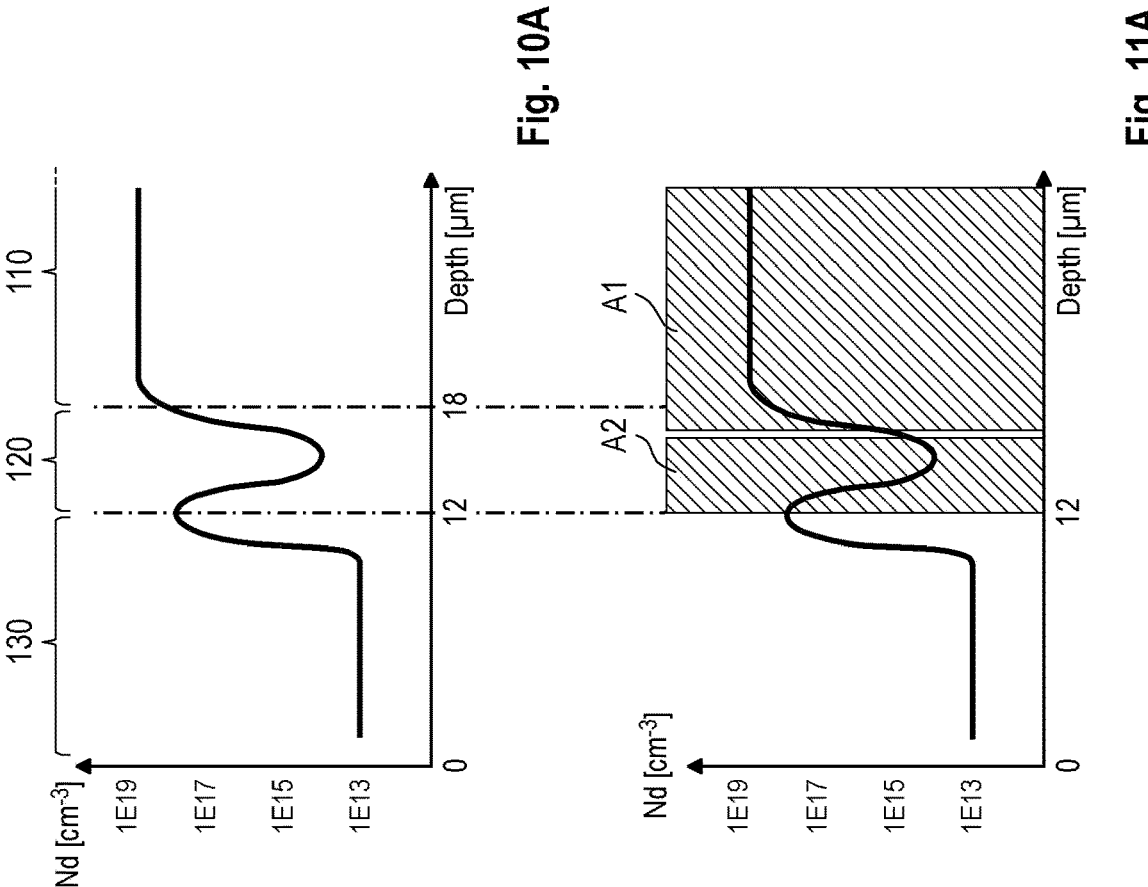
Fig. 11B
Fig. 11A

METHOD OF THINNING A SEMICONDUCTOR SUBSTRATE TO HIGH EVENNESS AND SEMICONDUCTOR SUBSTRATE HAVING A DEVICE LAYER OF HIGH EVENNESS

TECHNICAL FIELD

This disclosure relates generally to the field of manufacturing semiconductor devices, and in particular to the field of thinning a semiconductor substrate to high evenness.

BACKGROUND

Various semiconductor devices such as, e.g., backside-illuminated (BSI) image sensors require a thin crystalline semiconductor layer with a low total thickness variation (TTV).

Conventionally, thin crystalline silicon layers with low TTVs are manufactured by processes including grinding and dopant selective chemical etching of a semiconductor substrate, e.g. a wafer.

While grinding offers high removal rates of semiconductor material, the TTV after the grinding process is too high for many devices such as, e.g., BSI image sensors. On the other hand, dopant selective chemical etching allows achieving thin crystalline semiconductor layers with small TTVs. However, dopant selective chemical etching requires the thin crystalline semiconductor layer (device layer) to have a low doping density (e.g. less than $10^{17}$ cm$^{-3}$) to be resistant to the chemical etchant used in the process. This prevents this method from being used for manufacturing devices having high doping densities in at least parts thereof in order to achieve a high device performance.

For instance, certain 3D image sensors require a high doping density in at least parts thereof to achieve good demodulation contrast and depth resolution. The low doping density constraint of the device layer when subjected to dopant selective chemical etching prevents such sensors from being fabricated in BSI geometry. This, in turn, limits the possibility to shrink the pixel size of such image sensors to achieve higher image resolution.

An additional challenge for BSI technology is the alignment of lithography processes done on the wafer backside after bonding and thinning to features defined on the front side before the device layer is manufactured.

SUMMARY

According to an aspect of the disclosure, a method of manufacturing a semiconductor device is described. The method comprises providing a semiconductor substrate. The semiconductor substrate comprises a high-doped semiconductor substrate layer, a high-doped semiconductor device layer, and a low-doped semiconductor etch stop layer arranged between the high-doped semiconductor substrate layer and the high-doped semiconductor device layer. The high-doped semiconductor substrate layer is removed, wherein the removing comprises dopant selective chemical etching stopping at the low-doped semiconductor etch stop layer. Further, the low-doped semiconductor etch stop layer is thinned to generate an exposed surface of the high-doped semiconductor device layer.

According to another aspect of the disclosure, a semiconductor wafer comprises a low-doped semiconductor device layer, a high-doped semiconductor device layer arranged over the low-doped semiconductor device layer, and a low-doped semiconductor etch stop layer arranged over the high-doped semiconductor device layer. The low-doped semiconductor etch stop layer has a thickness between 1 μm and 12 μm, an exposed etch stop surface and a total thickness variation, TTV, of equal to or less than 1.0 μm.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other and/or can be selectively omitted if not described to be necessarily required. Embodiments are depicted in the drawings and are exemplarily detailed in the description which follows.

FIG. 1 is a schematic cross-sectional view of an exemplary carrier substrate and an exemplary device substrate at a stage of manufacturing a semiconductor device.

FIG. 2 is a schematic cross-sectional view of the exemplary carrier substrate and the exemplary device substrate of FIG. 1 at a manufacturing stage after substrate bonding.

FIG. 5 is a schematic cross-sectional view of the exemplary structure of FIG. 4 at a manufacturing stage after removal of a low-doped semiconductor etch stop layer of the exemplary device substrate.

FIG. 6 is a flowchart depicting stages of an exemplary method of manufacturing a semiconductor device in accordance with aspects of the disclosure.

FIG. 7 is a schematic cross-sectional view of an exemplary semiconductor device manufactured in accordance with aspects of the disclosure.

FIGS. 10A and 10B are diagrams illustrating the dependency of the doping concentration from the depth for a BSI image sensor in accordance with aspects of the disclosure (FIG. 10A) and for a conventional BSI image sensor (FIG. 10A) after layer deposition.

FIGS. 11A and 11B are diagrams illustrating the dependency of the doping concentration from the depth for a BSI image sensor in accordance with aspects of the disclosure after thinning the low-doped semiconductor etch stop layer (FIG. 11A) and for a conventional BSI image sensor after removing the high-doped semiconductor substrate layer (FIG. 11B).

DETAILED DESCRIPTION

Figure 3:
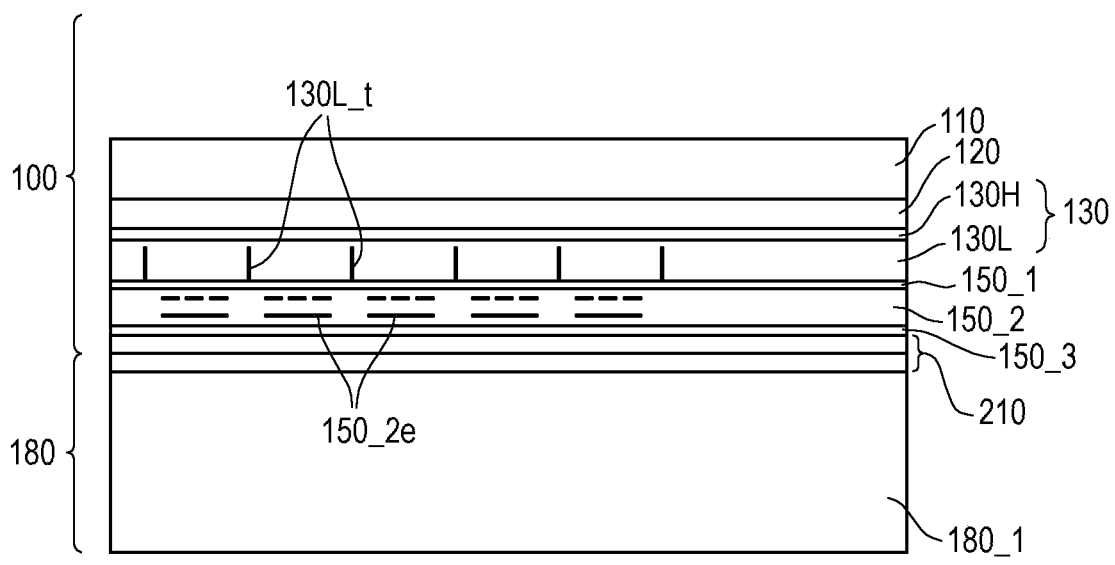
FIG. 3 is a schematic cross-sectional view of the exemplary structure of FIG. 2 at a manufacturing stage after partial removal of a high-doped semiconductor substrate layer of the exemplary device substrate.

It is to be understood that the features of the various exemplary embodiments and examples described herein may be combined with each other, unless specifically noted otherwise.

As used in this specification, the terms "deposited", "arranged on", or "applied" or similar terms are not meant to mean that the elements or layers must directly be contacted together; intervening elements or layers may be provided between the "deposited", "arranged on", or "applied" elements, respectively. However, in accordance with the disclosure, the above-mentioned and similar terms may, optionally, also have the specific meaning that the elements or layers are directly contacted together, i.e. that no intervening elements or layers are provided between the "deposited", "arranged on", or "applied" elements, respectively.

Further, the words "over" or "beneath" with regard to a part, element or material layer formed or located "over" or "beneath" a surface may be used herein to mean that the part, element or material layer be located (e.g. placed, formed, arranged, deposited, etc.) "directly on" or "directly under", e.g. in direct contact with, the implied surface. The word "over" or "beneath" used with regard to a part, element or material layer formed or located "over" or "beneath" a surface may, however, either be used herein to mean that the part, element or material layer be located (e.g. placed, formed, arranged, deposited, etc.) "indirectly on" or "indirectly under" the implied surface, with one or more additional parts, elements or layers being arranged between the implied surface and the part, element or material layer.

Referring to FIG. 1, a device semiconductor substrate 100 includes a high-doped semiconductor substrate layer 110, a high-doped semiconductor device layer 130H and a low-doped semiconductor etch stop layer 120, referred to as substrate 100, substrate layer 110, device layer 130H and etch stop layer 120 respectively hereinafter. The etch stop layer 120 is arranged between the substrate layer 110 and the device layer 130H.

The substrate 100 may, e.g., be a semiconductor wafer. The substrate 100 may be made of any semiconductor material, e.g., Si, SiC, SiGe, GaAs, GaN, AlGaN, InGaAs, InAlAs, etc. Without loss of generality, the following description relates to a substrate 100 which is a silicon wafer.

The substrate layer 110 may have a doping density which is, e.g., in a range between $1 \times 10^{18}$ cm$^{-3}$ to $5 \times 10^{20}$ cm$^{-3}$, in particular $3 \times 10^{18}$ cm$^{-3}$ to $3 \times 10^{19}$ cm$^{-3}$ or e.g. $4-6 \times 10^{18}$ cm$^{-3}$. The substrate layer 110 may be doped with boron, arsenic or phosphorus. In some applications arsenic may be advantageous as a dopant since it diffuses less and sharper doping profiles can be obtained. The substrate layer 110 may, e.g., have a thickness between about 600 μm and 1000 μm. In the example shown in FIG. 1, the thickness may, e.g., be 720 μm.

The doping density of the low-doped semiconductor etch stop layer 120 may, e.g., be equal to or less than $10^{17}$ cm$^{-3}$, or $10^{16}$ cm$^{-3}$, or $10^{15}$ cm$^{-3}$, or $10^{14}$ cm$^{-3}$. The low-doped semiconductor etch stop layer 120 may be an epitaxial layer. It may, e.g., have a layer thickness of 1-12 μm, in particular 2-6 μm. The dopant type may, e.g., be of no relevance.

The doping density of the device layer 130H may, e.g., be in a range between $10^{17}$ cm$^{-3}$ to $10^{19}$ cm$^{-3}$ and may, in particular, be equal to or greater than $5 \times 10^{17}$ cm$^{-3}$, or $10^{18}$ cm$^{-3}$, or $5 \times 10^{18}$ cm$^{-3}$. The device layer 130H may be doped with boron, arsenic, phosphorus, or antinomy. Generally, the dopant of the device layer 130H may be the same as the dopant of the substrate layer 110 or a different one. Further, the device layer 130H may have different doping levels and/or materials in different depths or different areas of the device layer 130H, i.e. may be structured in terms of doping levels and/or doping materials and/or doping depths and/or doping areas.

The substrate 100 may optionally further include a low-doped semiconductor device layer 130L. Hence, a device layer 130 of the semiconductor substrate 100 may include solely the device layer 130H or the device layer 130H and the low-doped semiconductor device layer 130L as depicted in FIG. 1.

In the latter case, the device layer 130H may, e.g., be a high-doped p-buried layer implant introduced into the low-doped semiconductor device layer 130L. More specifically, the device layer 130H may be fabricated by implanting a dopant such as, e.g., boron (implant dose of e.g. $7.5 \times 10^{14}$ cm$^{-2}$, implant energy of e.g. 25 keV). The implant impurities (e.g. boron impurities) may then be activated by annealing (e.g. at 1050° C.). Implant damages of the low-doped semiconductor device layer 130L may, e.g., be removed, for example by surface oxidation and wet chemical oxide removal.

An alternative method may be to grow the full layer stack comprising the etch stop layer 120 and the high-doped and low-doped device layers 130H, 130L by epitaxy in one or more runs with in-situ doping.

Further, the substrate 100 may comprise a functional layer stack 150. The design of the functional layer stack is dependent on the semiconductor device to be manufactured from the substrate 100. For example, the functional layer stack 150 may include one or more metal contact layers 150_2, insulating (e.g. SiO) layers 150_1, 150_3 encapsulating the metal contact layer(s) 150_2 and a wafer bonding (e.g. SiO) layer 150_4 for wafer bonding.

The device layer 130 (in particular the low-doped semiconductor device layer 130L) and the functional layer stack 150 may be structured depending on the semiconductor device to be manufactured from the substrate 100. In FIG. 1, by way of example, the low-doped semiconductor device layer 130L is structured by (optional) insulation trenches 130L_t. The metal contact layer(s) 150_2 are structured by groups of metal electrodes 150_2e. As will be described in more detail further below, the groups of metal electrodes 150_2e together with the insulating trenches 130L_t form pixels of a BSI image sensor used here as an example of a semiconductor device in accordance with the disclosure. In other embodiments the functional layer stack 150 may include other semiconductor devices such as, e.g., power semiconductor chips (see e.g. FIGS. 15A-15C).

Substrate 100 may be formed by complementary metal-oxide-semiconductor (CMOS) technology. The growth direction of the various layers 120, 130H, 130L, 150 atop the substrate layer 110 is indicated by arrow A.

As mentioned before, the low-doped semiconductor device layer 130L (in which the device layer 130H has been implanted) may be designed in various different ways in accordance with the characteristics and functionality of the semiconductor device to be manufactured. In the example described herein, the low-doped semiconductor device layer 130L may have been formed by Si epitaxy, may, e.g., have a thickness of about 3-20 μm, in particular 10-13 μm (which has been found to be preferable for high-performance time-of-flight (ToF) image sensors). Further, optionally desired doping profiles are generated in the low-doped semiconductor device layer 130L. For example, this may include creating a doping profile in epitaxy or by thermally induced interdiffusion from the buried device layer 130H into the epitaxial low-doped semiconductor device layer 130L. An exemplary doping profile of the (buried) device layer 130H in the low-doped semiconductor device layer 130L will be explained in more detail further below in conjunction with FIGS. 9A and 9B.

The low-doped semiconductor device layer 130L and the semiconductor device layer 130H may have a total thickness of equal to or less than 15 μm, or 10 μm, or 5 μm, or 3 μm, or 2 μm. However, it is also possible that the device layer 130H is (much) thicker, e.g. has a thickness of equal to or greater than 50 μm or 100 μm.

The optional insulating trenches 130L_t may be formed to create optically and/or electrically isolated pixels in the low-doped semiconductor device layer 130L. Further, as mentioned above, the formation of groups of metal electrodes 150_2e, e.g. metal contacts and gates, may define a matrix of pixels on the low-doped semiconductor device layer 130L.

The wafer bonding layer 150_4 may be formed by silicon oxide deposition and polishing. The wafer bonding layer 150_4 may have a thickness between, e.g., 50 to 200 nm and may, e.g., create an atomically smooth (e.g. having an unevenness of below 0.5 nm root mean square (RMS)) oxide surface layer.

Further, a carrier semiconductor substrate 180 may be provided. The carrier semiconductor substrate 180 may be a semiconductor wafer, e.g. a silicon wafer. The carrier semiconductor substrate 180 may comprise a carrier substrate layer 180_1 and a wafer bonding layer 180_4. The carrier substrate layer 180_1 may have a thickness in the same range as the thickness of the substrate layer 110, in this example, e.g., a thickness of 720 μm. The carrier semiconductor substrate 180 may (also) contain integrated circuits (ICs—not shown) and/or one or more metal wiring layer(s) (not shown) to interconnect the ICs either to integrated circuitry (e.g. specific pixels) on the substrate 100 or to electrodes or die pads (not shown) on the carrier semiconductor substrate 180 used as external terminals.

The wafer bonding layer 180_4 may, e.g., be a SiO layer having a layer thickness in a range between 1-200 nm. The wafer bonding layer 180_4 may be atomically smooth (e.g. having an unevenness below 0.5 nm RMS).

The carrier semiconductor substrate 180 may be used in a manufacturing process for devices featuring BSI geometry, e.g. for BSI image sensors, in particular for ToF image sensors employing BSI technology.

Referring to FIG. 2, the substrate (e.g. device wafer) 100 and the carrier semiconductor substrate (e.g. carrier wafer) 180 are then bonded together with their respective front sides. Voids and particles in the bond interface 210 formed by the wafer bonding layers 150_4 and 180_4 should be avoided. Annealing may be used to make the bond stable and durable.

If the carrier semiconductor substrate 180 contains for instance ICs to be connected to specific integrated circuitry (e.g. specific pixels) on the substrate 100, the bond between the substrate 100 and the carrier semiconductor substrate 180 should be generated with high spatial accuracy, preferably equal to or less than 200 nm or 150 nm. FIG. 2 illustrates an intermediate stage of fabrication after semiconductor substrate bonding (e.g. wafer bonding) and flipping the bonded device.

Referring to FIG. 3, the substrate layer 110 of the substrate 100 is then partially removed by, e.g., grinding. A thickness of, e.g., 600-1000 μm of the substrate layer 110 may be removed. The partial removal may stop at about 5-50 μm, in particular 5-15 μm, of the substrate layer 110 for subsequent wet chemical removal, as will be explained in more detail in conjunction with FIG. 4. The TTV after the partial removal (e.g. grinding) process may, for example, be 2-3 μm on, e.g., a 200 mm wafer, which is too high for some devices, e.g. for image sensor products.

Figure 4:
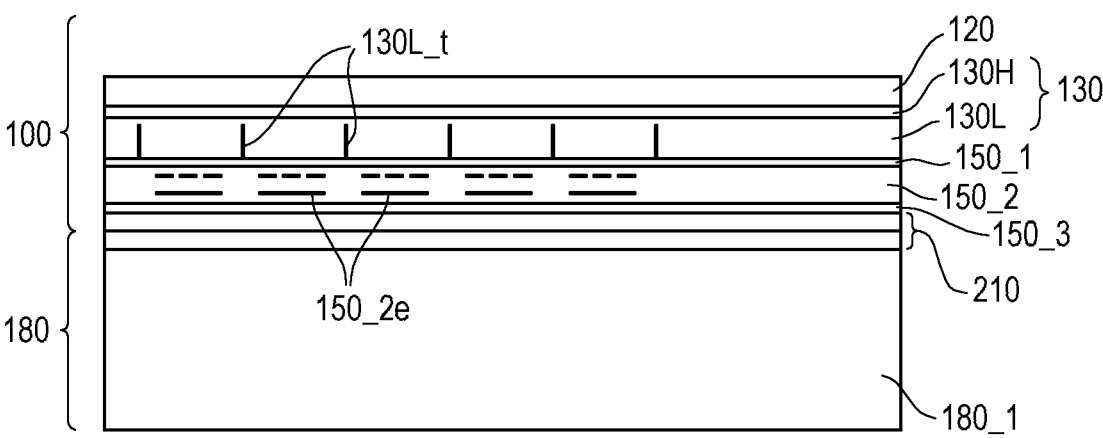
FIG. 4 is a schematic cross-sectional view of the exemplary structure of FIG. 3 at a manufacturing stage after complete removal of the high-doped semiconductor substrate layer of the exemplary device substrate.

Referring to FIG. 4, the substrate layer 110 may then be completely removed by dopant selective chemical etching until the etch stop layer 120 is reached. The removal by dopant selective chemical etching may remove a thickness between 5-50 μm, in particular 5-15 μm or 5-10 μm, of the remainder of the substrate layer 110. For the dopant selective chemical etching process, a dopant selective wet chemical solution may be used, which will etch the remainder of the substrate layer 110 quickly at, e.g., a rate of 10-50 μm/min. The dopant selective chemical etching process will hold at the etch stop layer 120 before reaching the device layer 130H.

More specifically, a dopant selective etchant such as, e.g., HNA may be used. This is a mixture of hydrofluoric acid (HF), nitric acid ($HNO_3$), acetic acid ($CH_3COOH$) and water. A typical concentration may be HF at 10 wt %, $HNO_3$ at 20 wt %, and $CH_3COOH$ at 50 wt %. The HNA mixture etches high-doped silicon quickly, e.g. with an etch rate of 20-40 μm/min. Low-doped materials are etched very slowly, e.g. at a rate of 0.2 μm/min. Thereby, the etchant removes the highly doped substrate and with it all roughness and on-substrate inhomogeneity brought in by the initial rough grinding process. The dopant selective chemical etching stops "inside" the etch stop layer 120 where the doping density falls below a certain limit (as described in more detail further below in conjunction with FIGS. 9A, 9B).

The TTV of the remaining semiconductor layers on top of the carrier semiconductor substrate 180 (i.e. of the layers of the substrate 100 at the intermediate stage of fabrication shown in FIG. 4) may, e.g., be between 0.1 and 1.0 μm on, e.g. a 200 mm wafer. It is much lower than the TTV of the remaining semiconductor layers on top of the carrier semiconductor substrate 180 at the intermediate stage of fabrication shown in FIG. 3, and is thus suitable for, e.g., image sensor products. More specifically, referring to FIG. 4, a TTV of e.g. 0.78 μm was achieved, which is sufficient and can be further improved by improving the homogeneity of the epitaxial layer thickness of the etch stop layer 120 and the low-doped semiconductor device layer 130L.

Referring to FIG. 5, the etch stop layer 120 is then removed to expose the device layer 130H. An exposed surface of the device layer 130H is denoted by reference sign 530. The device layer 130H may then have a low TTV since inhomogeneities from the grinding process (FIG. 3) are neutralized by the etch stop layer 120. At the same time the device layer 130H can be highly doped since it does not come in contact with a dopant selective etch chemistry.

The etch stop layer 120 should be thick enough to provide a reliable barrier for the dopant selective wet chemical etching solution to protect the device layer 130H. Dopant inter-diffusion from the substrate layer 110 and from the device layer 130H may reduce its effective thickness, especially when high temperature processes at temperatures equal to or greater than, e.g., 1000° C. are applied to the substrate (device wafer) 100 and the carrier semiconductor substrate (carrier wafer) 180.

On the other hand, the etch stop layer 120 should not be too thick since then the additional thickness variations caused during its removal (see FIG. 5) would be too high to achieve the target of having a low TTV of, e.g., equal to or less than 1 µm after the removal of the etch stop layer 120. The thickness of the etch stop layer 120 may, e.g., be between 1 µm and 12 µm, wherein a thickness of 6 µm±3 µm (or ±2 µm, or ±1 µm, or ±0 µm) has shown to be a good compromise for both challenges mentioned above.

Differently put, the provision of the etch stop layer 120 allows for implementing a device layer 130H (as it is desired for device performance) and the small thickness of the etch stop layer 120 allows to preserve the small initial TTV at the onset of thinning throughout the thinning process until it ends at the exposed surface 530 of the device layer 130H.

The optimum thickness of the etch stop layer 120 may also depend on the type of dopant. The etch stop layer 120 may be made thinner (e.g. thinner than 6 µm) if heavy dopant atoms such as arsenic are used in the substrate layer 110 and/or in the device layer 130H. Those dopants show less inter-diffusion into the etch stop layer 120 during high temperature processing, resulting in that the effective thickness of the etch stop layer 120 is reduced by inter-diffusion to a lesser extent (and therefore the actual thickness can be designed smaller).

The removal of the etch stop layer 120 may be carried out by chemical etching or by chemical mechanical polishing (CMP). Chemical etching may be carried out by a wet chemical etching process or a dry chemical etching process.

CMP may be the preferred method since the CMP process has more degrees of freedom that can be controlled than the wet or dry chemical etching process (where additional unevenness may be caused by different etching rates). Using CMP the removal rate can be tuned to achieve a minimum total thickness variation across the wafer. For example, if the remaining etch stop layer 120 is typically thinner at the edge of the substrate (wafer) than in the middle of the substrate (wafer), which might be due to higher etch rates in the preceding steps due to heating of the etchant towards the substrate (wafer) edge, then the CMP removal rate can be reduced at the substrate (wafer) edge to compensate this thickness variation. An example of such improvement of TTV by CMP will be described further below in conjunction with FIG. 13.

The total amount of material to be removed in one run is limited to <6 µm, preferably <3 µm. Also for this reason, it is desirable to have the etch stop layer 120 as thin as possible. This, however, opposes the requirement for a robust etch stop process without runaway etching as well as inter-diffusion of dopants from the neighboring substrate layer 110 and device layer 130H. To enable a thinner etch stop layer 120, while at the same time maintaining a robust etch stopping behavior in presence of inter-diffusing dopants from the device layer 130H, the etch stop layer 120 may be counter-doped with a material of opposing dopant polarity, as will be described in more detail further below in conjunction with FIG. 12B.

Referring to FIG. 6, at S1 a semiconductor substrate is provided comprising a substrate layer, a device layer and a etch stop layer arranged between the substrate layer and the device layer. As mentioned above, the etch stop layer may, e.g., have a thickness between 1 µm and 12 µm.

At S2 the substrate layer is removed. The removing comprises dopant selective chemical etching which stops at the etch stop layer. An exemplary intermediate stage of fabrication obtained by S2 is illustrated in FIG. 4.

At S3 the etch stop layer is thinned to generate an exposed surface of the device layer. A stage of fabrication which may be obtained after carrying out S3 is illustrated in FIG. 5.

FIG. 7 illustrates a simplified final ToF image sensor device as an example of a semiconductor device 700 manufactured in accordance with aspects of the disclosure. The semiconductor device 700 may include micro-lenses 710, a metal grid 720, a through semiconductor via 730 and an insulating layer 740. The through semiconductor via 730 may be configured to electrically contact the buried metal contact layer(s) 150_2 beneath the low-doped semiconductor device layer 130L and the device layer 130H. The micro-lenses 710 may be fabricated on top of the pixel array and the metal grid 720 may be arranged to direct or shield incident light from certain parts of the pixels (as defined by the insulating trenches 130L_t and the groups of metal electrodes 150_2e). Electrode pads 750 (e.g. made of Al or Cu) may be placed on the through semiconductor vias 730.

Finally, the semiconductor device 700 is tested, diced and placed in an adequate package which allows infrared light to reach the pixel array surface. To achieve ToF 3D imaging this package may be assembled in a system which includes an infrared light source such as laser diode to emit light in a temporarily modulated or pulsed way. The ToF of the reflections of these light pulses of a free-dimensional scene is then detected by the pixels of the semiconductor device 700, and a 3D rendering of the scene may be reconstructed.

Figure 8D:
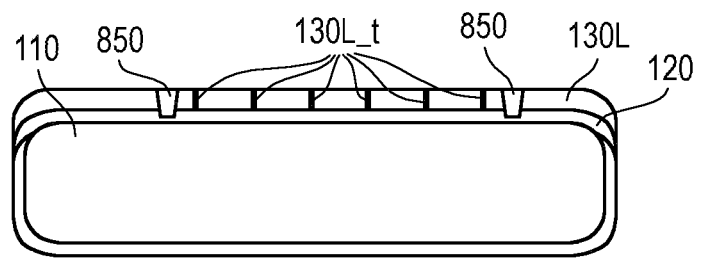
FIGS. 8A-8P are schematic cross-sectional views illustrating exemplary stages of a process flow to manufacture a semiconductor device in accordance with aspects of the disclosure.
Figure 8E:
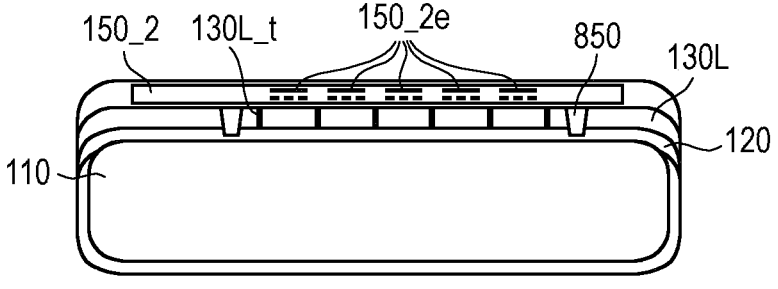
Figure 8F:
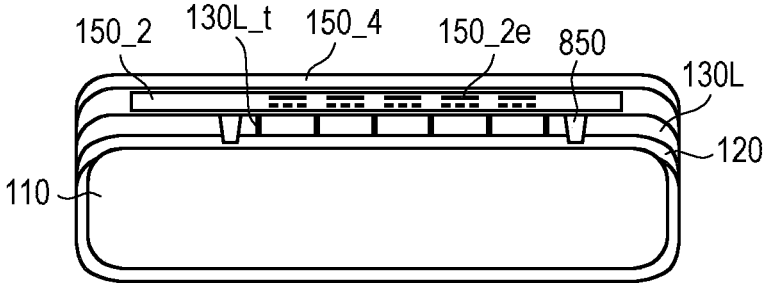
Figure 8G:
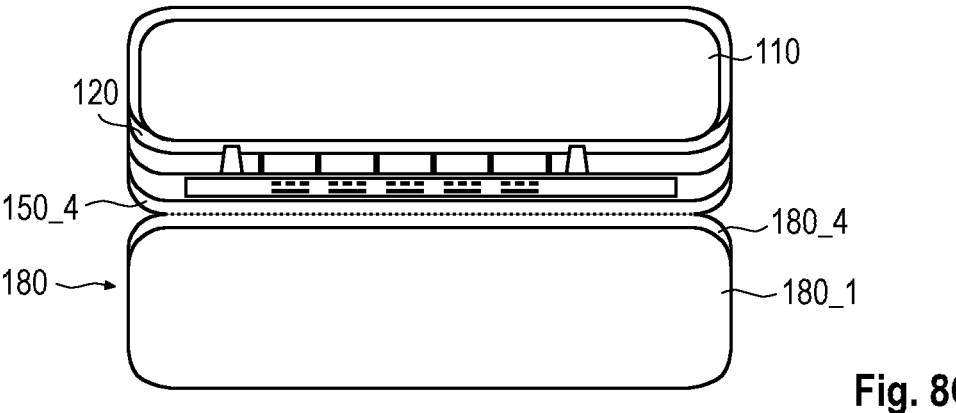
Figure 8H:
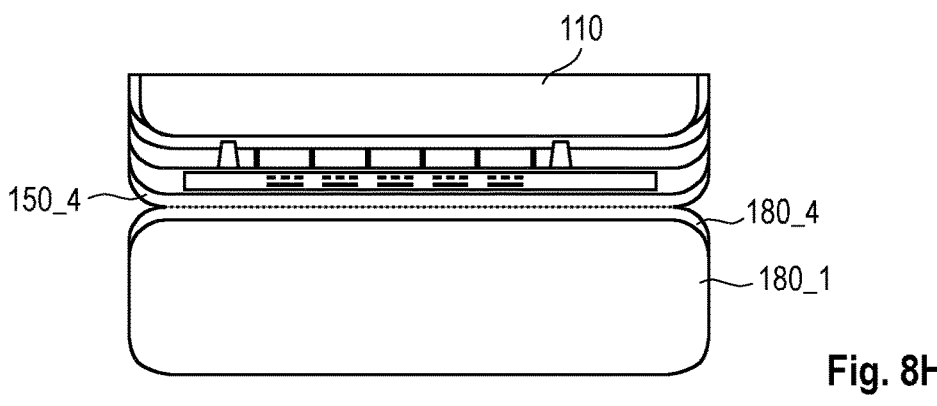
Figure 8I:
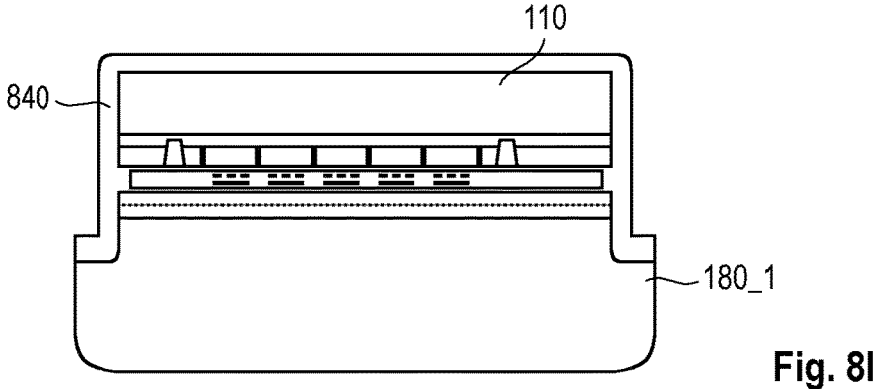
Figure 8J:
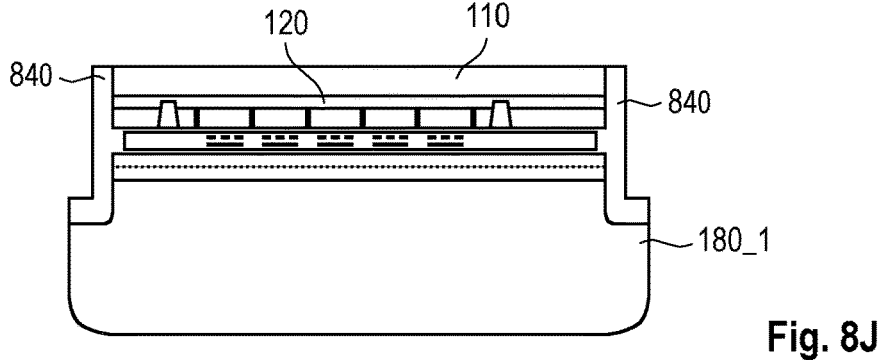
Figure 8K:
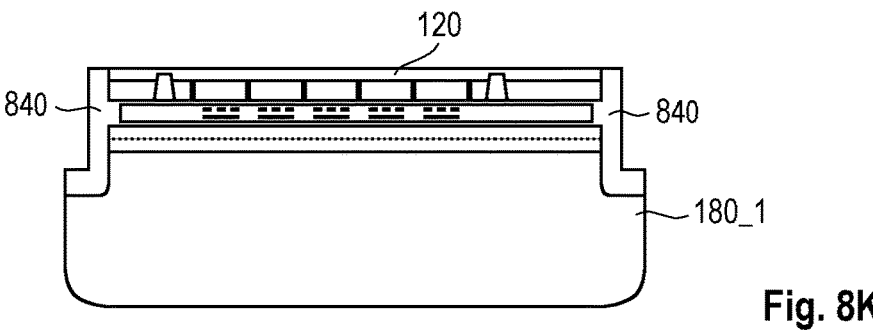
Figure 8L:
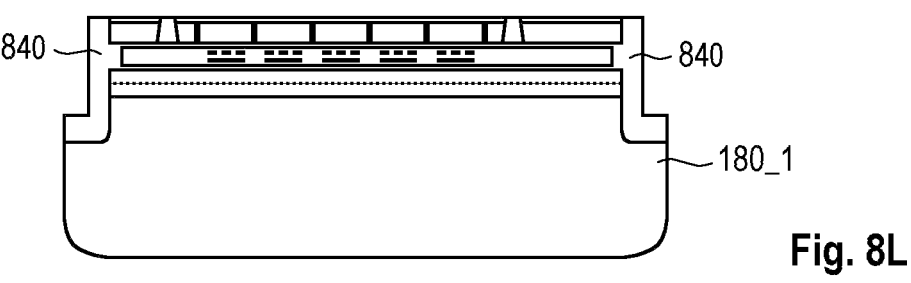
Figure 8M:
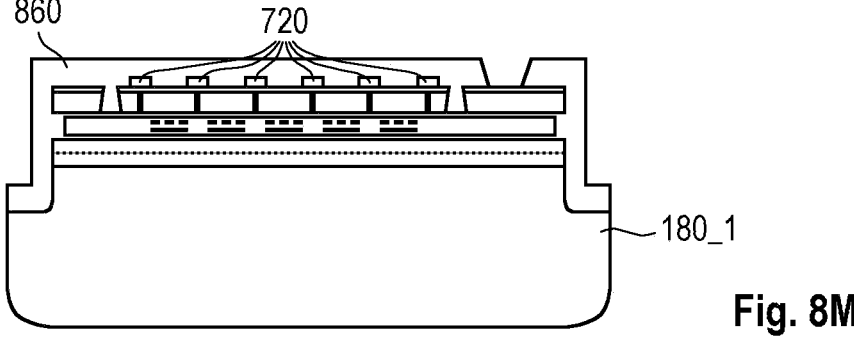
Figure 8N:
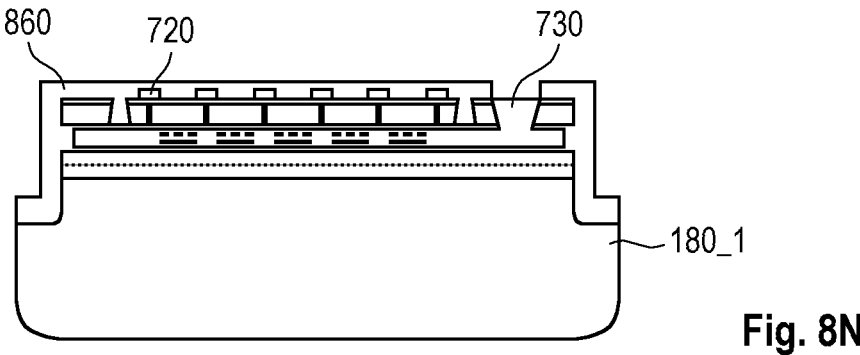
Figure 8O:
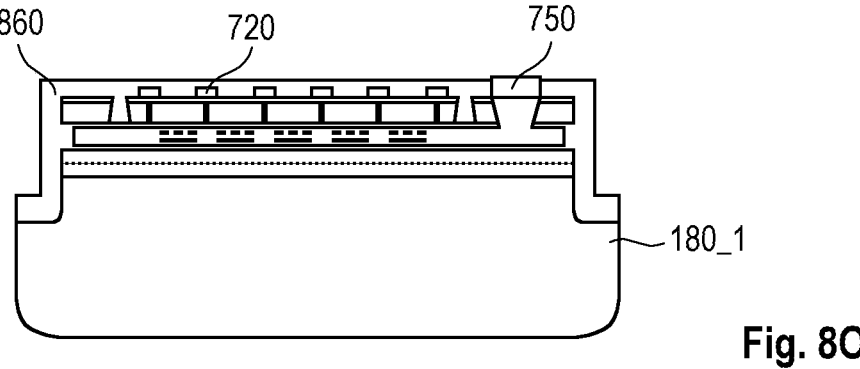
Figure 8P:
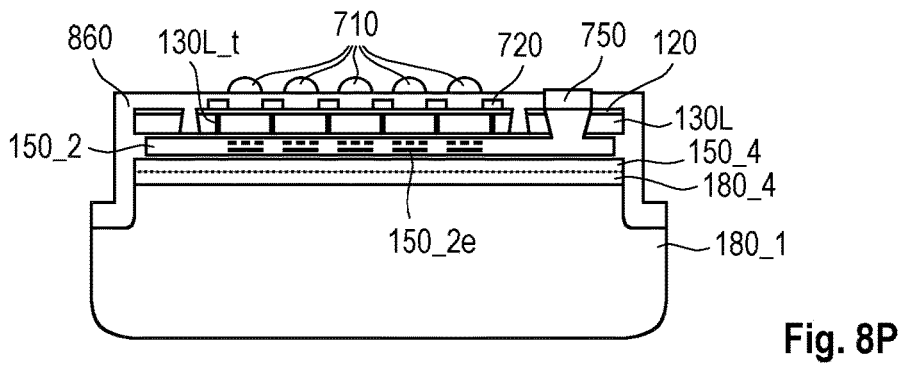

FIGS. 8A-8P illustrate an exemplary process flow to manufacture a semiconductor device in accordance with aspects of the disclosure. The exemplary stages illustrated in FIGS. 8A-8P can selectively be combined with manufacturing stages described above and vice versa. In particular, the process flow shown in FIGS. 8A-8P illustrates trimming of the wafer edge during grinding to reduce unwanted particle density due to chipping at the wafer edge and/or a deposition of an edge protection layer which protects the device layers 130L, 130H especially during wet etching (see FIG. 8I). Both these processes (trimming of the wafer edge and/or depositing of an edge protection layer) are generally available and not bound to the specific process flow of FIGS. 8A-8P.

FIG. 8A illustrates a device wafer 100 having the substrate layer 110. This high-doped semiconductor wafer may be a 200 mm Si high-doped backside epitaxial sealing wafer.

In FIG. 8B, the etch stop layer 120 is generated. The etch stop layer 120 may be an epitaxial layer of a thickness of, e.g., 1-12 µm.

In FIG. 8C the low-doped semiconductor device layer 130L (e.g. boron, doping density of $7.6×10^{14}$ cm$^{-3}$, thickness of 12 µm Si) may be generated as an epitaxial layer. Then, the device layer 130H may be formed as a buried implant layer (e.g. p-buried implant layer).

In FIG. 8D the deep trench isolation (i.e. insulating trenches 130L_t) may be generated. Further, zero layer deep trenches 850 may be produced.

In FIG. 8E the ToF metal contact layers 150_2 are applied.

In FIG. 8F the wafer bonding layer 150_4 is applied by, e.g., using an oxide formation and a CMP process.

In FIG. 8G the processed device wafer of FIG. 8F is wafer bonded to a carrier wafer 180 by, e.g., silicon direct bonding (SDB) and/or silicon fusion bonding (SFB).

FIGS. 8H-8J illustrate an exemplary two-stage grinding process and an edge trimming and protection step carried out between the two grinding stages. More specifically, in FIG. 8H a first stage grinding is performed to a target thickness of, e.g., 150 μm of the residual substrate layer 110. Then, in FIG. 8I the wafer edges are trimmed (e.g. 1 mm wide) and a TEOS (tetraethyl orthosilicate) oxide 840 (or any other edge protection insulating material) is deposited by, e.g., plasma-enhanced chemical vapor deposition (PECVD).

In FIG. 8J a second stage grinding is performed to a target thickness of, e.g., 25 μm of the substrate layer 110.

FIG. 8K illustrates wet etching which stops on the etch stop layer 120. A cleaning of the surface of the etch stop layer 120 may follow. A TTV of about 500 nm may be obtained.

FIG. 8L illustrates CMP of the etch stop layer 120. The TTV of 500 nm may substantially be preserved. Additionally, zero layer marks 850 may be revealed by this step so they are visible on the wafer surface in subsequent process steps.

FIGS. 8M-8P then illustrates process stages which are specifically used when a ToF BSI image sensor is fabricated. Briefly, in FIG. 8M a tungsten grid 720 may be applied and a lithography mask 860 (e.g. SiO/SiN) may be applied for TSV (through silicon via) formation.

FIG. 8N illustrates a TSV etch and a filling the etch hole with a metal, e.g. Cu.

In FIGS. 8O and 8P an electrode pad (e.g. Al pad) 750 is applied and the micro-lenses 710 are fabricated.

Figure 9A:
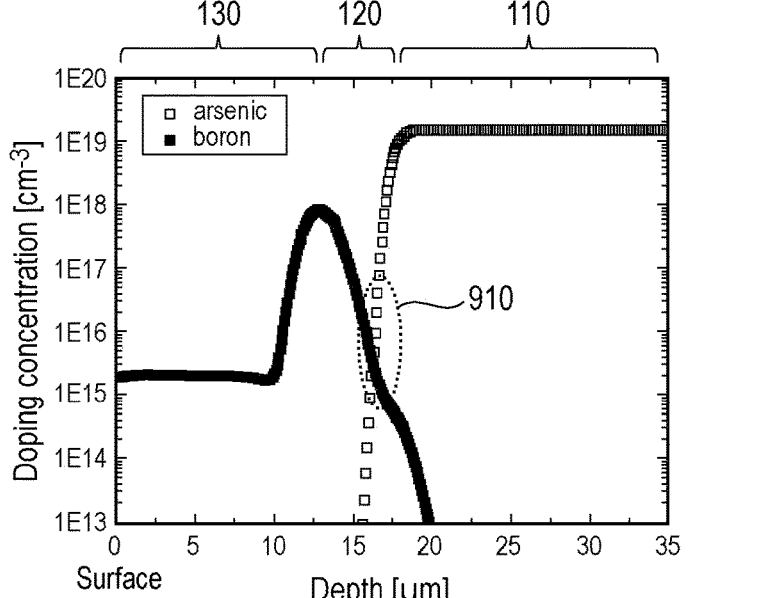
FIGS. 9A and 9B are diagrams illustrating the dependency of the doping concentration from the depth as obtained by simulation (FIG. 9A) and by measurement (FIG. 9B).

FIG. 9A illustrates a simulated doping density profile in silicon of a wafer after forming the low-doped semiconductor (i.e. Si) etch stop layer 120 and the semiconductor (i.e. Si) device layers 130L, 130H on the high-doped semiconductor (i.e. Si) substrate layer 110 corresponding to the intermediate fabrication stage shown in FIG. 1. The etch stop layer 120 is a Si epitaxial layer situated between the substrate layer 110 and the device layer 130H. Only semiconductor (i.e. Si) layers are shown, other materials such as SiO or metals are omitted. In this case, the substrate layer 110 is arsenic doped (n-type) and the device layers 130L and 130H are boron doped (p-type). This leads to a compensation of both dopants and thus to a low electrical carrier density in a certain range within the etch stop layer 120. By way of example, etching has been done for 40 s with an etch rate in the high-doped semiconductor (i.e. Si) device layer of about 40 μm/min.

Figure 9B:
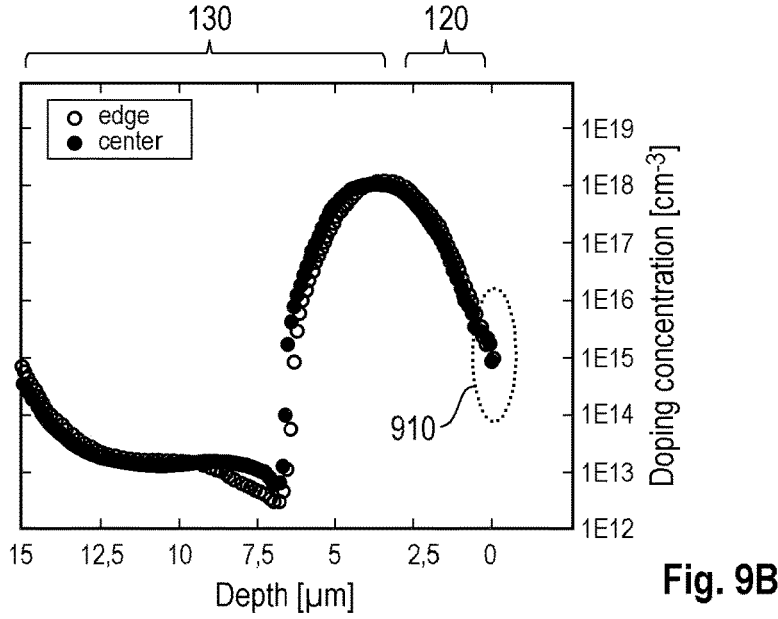

FIG. 9B illustrates the doping density profile measured by spreading resistance profiling (SRP) on a device Si substrate (wafer) 100 after removing the substrate layer 110 with dopant selective HNA wet etch corresponding to the intermediate fabrication stage shown in FIG. 4. Hence, in FIG. 9B the depth 0 corresponds to the surface of the low-doped Si etch stop layer 120. The encircled area 910 in FIG. 9A corresponds to the encircled area 910 in FIG. 9B.

By comparing the measured doping density profile of FIG. 9B to the simulated doping density profile of FIG. 9A it can be inferred that the doping density limit at which HNA etching stops is about $10^{17}$ cm$^{-3}$. During etching, the temperature at the device Si substrate (wafer) surface has been monitored and it was observed that the temperature dropped from more than 30° C. to about room temperature at a certain point in time and stayed low. This is consistent with the exothermal etching process stopping at a certain depth in the layer stack.

Further, FIG. 9B shows that the doping density profile only slightly varies between the center of the substrate (wafer) 100 and its edge.

To illustrate the effect of a dedicated etch stop layer 120 for the thinning process for, e.g., BSI devices having a device layer 130H, doping profiles before and after thinning are shown in FIGS. 10A and 11A with a dedicated etch stop layer 120 and in FIGS. 10B and 11B without such dedicated etch stop layer 120.

In FIG. 11A the hatched area A1 is removed in the first thinning step using dopant selective chemical etching while the hatched area A2 is removed in the second thinning stage using, e.g., non-selective dry or wet etching or CMP. In FIG. 11B relating to BSI image sensor fabrication without using a etch stop layer 120, the hatched area A1 showing the first thinning step using dopant selective chemical etching is also depicted. The main difference between the BSI image sensor fabrication without (FIG. 11B) and with (FIG. 11A) using a etch stop layer 120 is that the device layer 130H is etched away by the HNA etchant in FIG. 11B while in FIG. 11A the etching stops clearly before reaching the device layer 130H. Hence, for a device, which should contain a high-doped layer at the surface, a dedicated etch stop layer 120 is needed.

Further, the layer thickness was measured after thinning with and without using a dedicated etch stop layer 120. If a dedicated etch stop layer 120 was used the TTV of the substrate 100 after thinning was equal to or less than 1 μm (in this example, a TTV of 0.78 μm was measured). If no dedicated etch stop layer 120 was used, a TTV of 2.11 μm was measured.

Figure 12A:
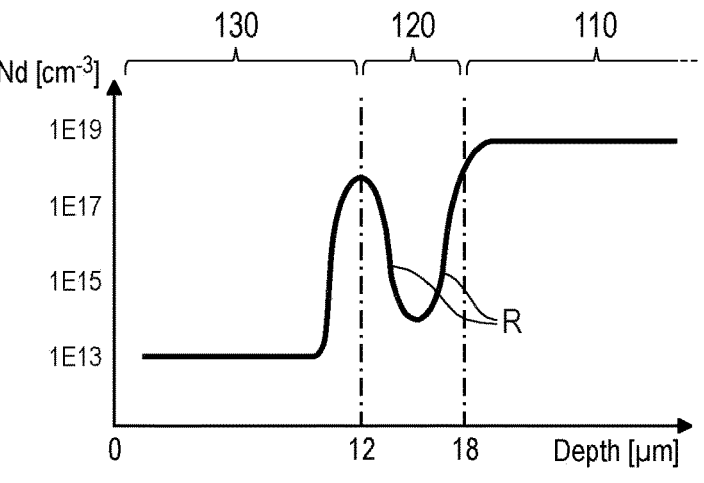
FIGS. 12A and 12B are diagrams illustrating the dependency of the doping concentration from the depth for a BSI image sensor in accordance with aspects of the disclosure without counter-doping in the low-doped semiconductor etch stop layer (FIG. 12A) and with counter-doping in the low-doped semiconductor etch stop layer (FIG. 12B).
Figure 12B:
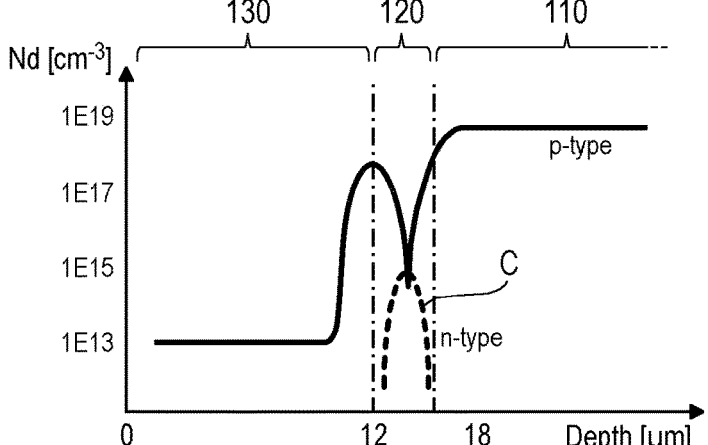

Referring to FIG. 10A, the rounded form R of the doping profile within the etch stop layer 120 is attributed to dopant inter-diffusion both from the substrate layer 110 and from the device layer 130H. The effect of counter-doping the etch stop layer 120 is illustrated by a comparison of FIG. 12A (which corresponds to FIG. 10A) and FIG. 12B. FIG. 12B shows a doping profile of an etch stop layer 120 with implanted n-type counter-doping of a doping density C. In case of a p-type (e.g. boron) doped semiconductor device layer 130L, 130H, the etch stop layer 120 may be n-type doped, e.g. with arsenic, phosphorus or antinomy. This counter-doping compensates the dopant inter-diffusion at R. If the doping density C of counter-doping is close to the doping density of inter-diffusing atoms, the resulting electrical carrier density in the inter-diffused region R of the etch stop layer 120 is reduced, and thus it will have a lower etch rate in, e.g., HNA.

Figure 13:
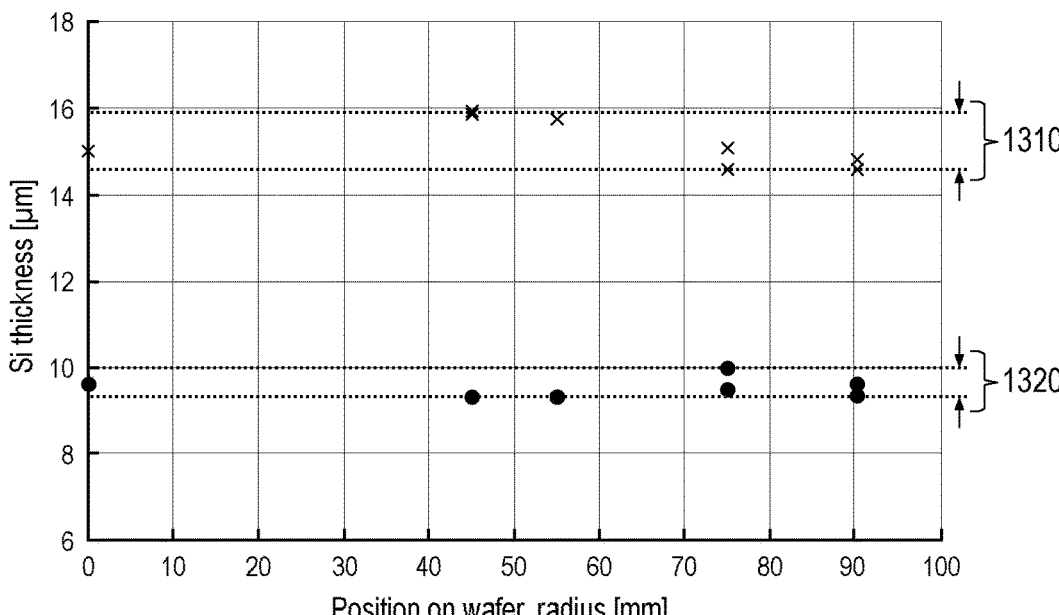
FIG. 13 is an illustration showing an exemplary measured layer thickness at different stages of thinning before and after chemical mechanical polishing (CMP).

FIG. 13 illustrates a measured layer thickness at different stages of thinning, namely before CMP of the etch stop layer 120 at 1310 and after CMP of the etch stop layer 120 at 1320. As apparent from FIG. 13, in this example the thickness of the substrate 100 is reduced by CMP from about 16 μm to about 10 μm (i.e. the etch stop layer 120 had a thickness of about 6 μm). FIG. 13 illustrates the improvement of TTV by the CMP process (which could not be achieved by chemical etching). The improvement can mainly be attributed to the tuning of the removal rate across the wafer radius when using CMP as the method of thinning the etch stop layer 120.

Figure 14:
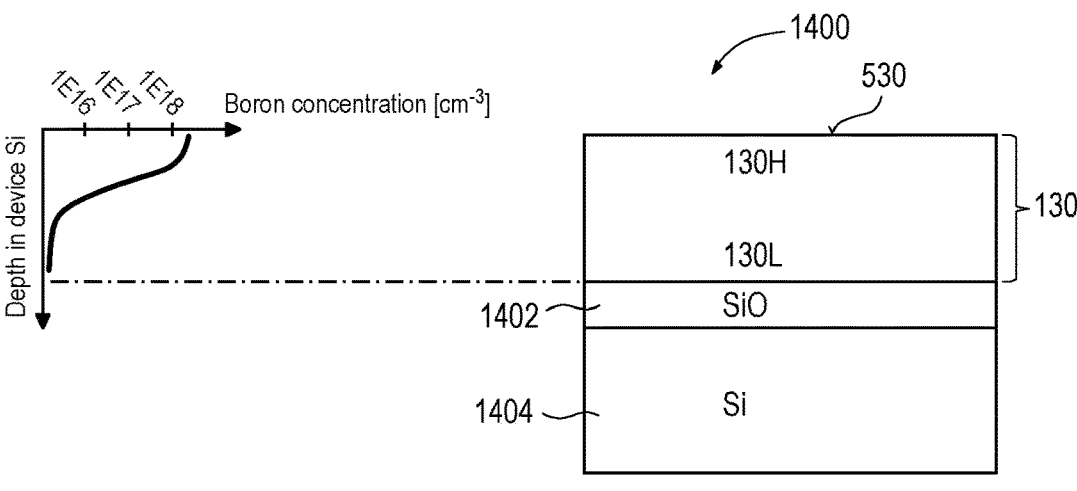
FIG. 14 is an illustration showing an exemplary semiconductor device with a high doping concentration at the surface and a low TTV.

As mentioned earlier, some semiconductor devices as, e.g., BSI image sensors require a high doping density at least in parts of the device layer in order to achieve good device performance. An example of such doping profile required in those semiconductor devices is shown in FIG. 14. As mentioned before, the TTV of the semiconductor device 1400 may be equal to or less than 1.0 μm. In the example shown in FIG. 14, the semiconductor device 1400 includes the device layer 130 having the device layer 130H and the low-doped semiconductor device layer 130L followed by an insulating layer 1402 (which may, e.g., correspond to the insulating layer 150_1) and by a semiconductor substrate layer 1404 implementing, e.g., ICs or other semiconductor device structures.

Figure 15A:
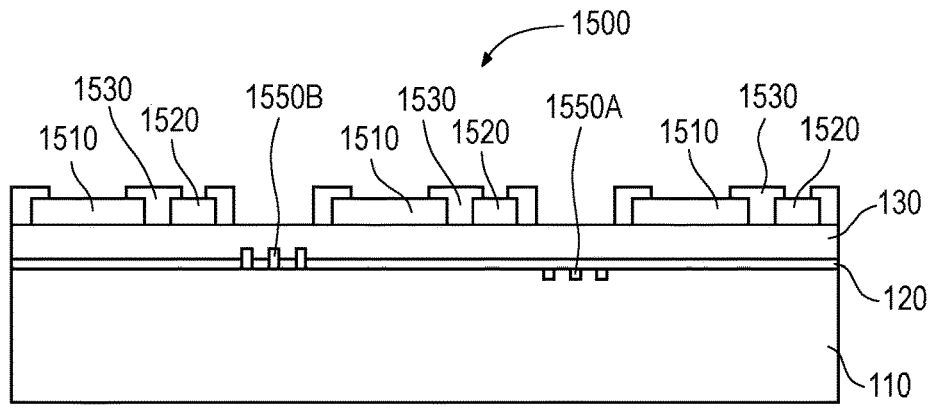
FIGS. 15A-15C are schematic cross-sectional views of an exemplary semiconductor device in accordance with aspects of the disclosure illustrating patterning the low-doped semiconductor etch stop layer to produce visible alignment marks.

FIG. 15A illustrates an exemplary semiconductor device 1500 before grinding and etching, i.e. at a stage of fabrication similar to that shown in FIG. 1. Semiconductor device 1500 distinguishes from the semiconductor device shown in FIGS. 1 through 5 and 7 to 8 in that the semiconductor device 1500 implements power semiconductor transistors rather than an image sensor. More specifically, the semiconductor device 1500 may include a first electrode (e.g. source pad) 1510, a second electrode (e.g. gate pad) 1520 and an insulating layer (e.g. imide layer) 1530. Integrated circuitry such as, e.g., transistors, in particular power transistor, may be provided in the device layer 130 and electrically connected to the first and second electrodes 1510, 1520. Further, the semiconductor device 1500 includes the etch stop layer 120 and the substrate layer 110. In view of the device layer 130, the etch stop layer 120 and the substrate layer 110 reference is made to the description above in order to avoid reiteration. In particular, the device layer 130 may include exclusively a device layer 130H (which is structured to implement the transistors) or a combination of the device layer 130H and the low-doped semiconductor device layer 130L as described above.

FIG. 15A further illustrates first type alignment features 1550A and second type alignment features 1550B. The first type alignment features 1550A may comprise low-doped regions protruding into the substrate layer 110. The second type alignment features 1550B may comprise high-doped regions protruding into the device layer 130.

The first type and second type alignment feature 1550A, 1550B may be generated by patterning the etch stop layer 120 to generate alignment features, which are configured to appear as visible alignment marks at a later stage of the fabrication of the semiconductor device 1500. More specifically, the first and second type alignment features 1550A, 1550B are configured to appear as visible alignment marks 1550A' and 1550B', respectively, in or on the exposed surface 530 of the device layer 130 after thinning.

Figure 15B:
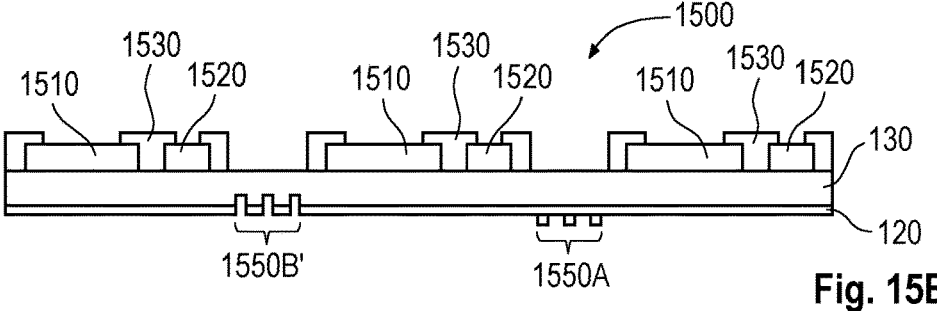

FIG. 15B illustrates the semiconductor device 1500 at a stage of fabrication after grinding and etching down to the etch stop layer 120. Hence, the fabrication stage of FIG. 15B compares to the fabrication stage illustrated in FIG. 4 for the example of an image sensor. Again, reference is made to the above description for the sake of brevity and in order to avoid reiteration.

Figure 15C:
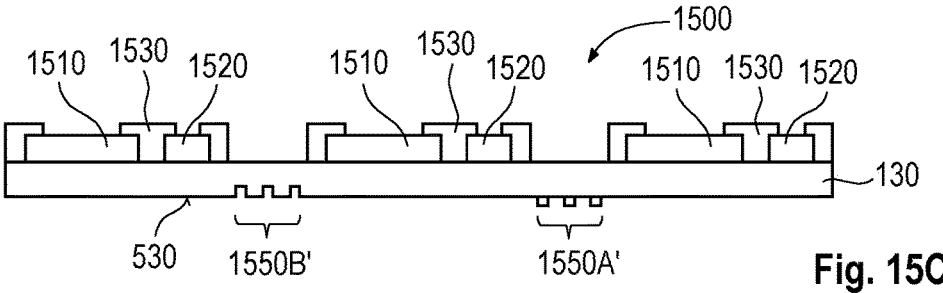

FIG. 15C illustrates a stage of fabrication of the semiconductor device 1500 which compares to the stage of fabrication shown in FIG. 5, i.e. after the removal of the etch stop layer 120. At this stage of fabrication, the exposed surface 530 of the device layer 130 is laid bare. The alignment marks are preserved in the etch process removing the etch stop layer 120. More specifically, the first type alignment marks 1550A' (which are, e.g., structured from the etch stop layer 120) and the second type alignment marks 1550B' (which are, e.g., etched out of the device layer 130)

are clearly visible thereon. Again, reference is made to the above description for the sake of brevity and in order to avoid reiteration.

The alignment marks 1550A' and 1550B' facilitate backside to front side alignment of lithographic processes. Differently put, the alignment marks 1550A' and 1550B' allow to better align lithographic processes done on the wafer backside after bonding and thinning to features defined on the front side before those steps. For example, returning to the BSI image sensor described above, the alignment marks 1550A' and/or 1550B', if similarly be formed on the exposed surface 530 of the device layer 130 (compare FIG. 5), allow to carry out all steps after wafer bonding (compare FIG. 8G-8P) with significantly higher accuracy and process reliability.

All characteristics, features and manufacturing variations explained above in conjunction with different embodiments can be selectively combined if not stated to the contrary or excluded by technical constraints. This applies in particular to the semiconductor transistor embodiment and the semiconductor image sensor embodiment described herein.

The following examples pertain to further aspects of the disclosure:

Example 1 is a method of manufacturing a semiconductor device, the method comprising providing a semiconductor substrate comprising a high-doped semiconductor substrate layer, a high-doped semiconductor device layer, and a low-doped semiconductor etch stop layer arranged between the high-doped semiconductor substrate layer and the high-doped semiconductor device layer. The method further comprises removing the high-doped semiconductor substrate layer, the removing comprises dopant selective chemical etching stopping at the low-doped semiconductor etch stop layer; and thinning the low-doped semiconductor etch stop layer to generate an exposed surface of the high-doped semiconductor device layer.

In Example 2, the subject matter of Example 1 can optionally include wherein thinning the low-doped semiconductor etch stop layer comprises chemical mechanical polishing, CMP, or chemical etching.

In Example 3, the subject matter of Example 1 or 2 can optionally include wherein removing the high-doped semiconductor substrate layer comprises partially removing the high-doped semiconductor substrate layer by grinding; followed by completely removing the residual high-doped semiconductor substrate layer by the dopant selective chemical etching.

In Example 4, the subject matter of any preceding Example can optionally include wherein a total thickness variation, TTV, of the low-doped semiconductor etch stop layer after removing the high-doped semiconductor substrate layer is equal to or less than 1.0 μm.

In Example 5, the subject matter of any preceding Example can optionally include wherein the low-doped semiconductor etch stop layer is an epitaxial layer.

In Example 6, the subject matter of any preceding Example can optionally include wherein the low-doped semiconductor etch stop layer is doped by a first dopant and counter-doped by a second dopant of opposite dopant polarity than the first dopant.

In Example 7, the subject matter of any preceding Example can optionally include wherein a total thickness variation, TTV, of the high-doped semiconductor device layer after thinning the low-doped semiconductor etch stop layer is equal to or less than 1.0 μm.

In Example 8, the subject matter of any preceding Example can optionally include wherein the high-doped semiconductor device layer is arranged on a low-doped semiconductor device layer and wherein the low-doped semiconductor device layer and the high-doped semiconductor device layer have a total thickness of equal to or less than 15 µm, or 10 µm, or 5 µm, or 3 µm, or 2 µm.

In Example 9, the subject matter of any preceding Example can optionally include wherein patterning the low-doped semiconductor etch stop layer to generate alignment features which are configured to appear as visible alignment marks in or on the exposed surface of the high-doped semiconductor device layer after thinning.

Example 10 is a semiconductor wafer, comprising: a low-doped semiconductor device layer, a high-doped semiconductor device layer arranged over the low-doped semiconductor device layer, and a low-doped semiconductor etch stop layer arranged over the high-doped semiconductor device layer, wherein the low-doped semiconductor etch stop layer has a thickness between 1 µm and 12 µm, an exposed etch stop surface and a total thickness variation, TTV, of equal to or less than 1.0 µm.

In Example 11, the subject matter of Example 10 can optionally include wherein a doping density of the low-doped semiconductor etch stop layer is equal to or less than $10^{17}$ cm$^{-3}$, or $10^{16}$ cm$^{-3}$, or $10^{15}$ cm$^{-3}$.

In Example 12, the subject matter of Example 10 or 11 can optionally include wherein a doping density of the high-doped semiconductor device layer is equal to or greater than $10^{17}$ cm$^{-3}$, or $10^{18}$ cm$^{-3}$, or $5 \times 10^{18}$ cm$^{-3}$.

In Example 13, the subject matter of any of Examples 10 to 12 can optionally include wherein the thickness of the high-doped semiconductor device layer is equal to or less than 15 µm, or 10 µm, or 5 µm, or 3 µm, or 2 µm as measured between a first surface of the high-doped semiconductor device layer bordering the low-doped semiconductor etch stop layer and a second surface the high-doped semiconductor device layer bordering the low-doped semiconductor device layer.

In Example 14, the subject matter of any of Examples 10 to 13 can optionally include wherein the low-doped semiconductor etch stop layer is doped by a first dopant and counter-doped by a second dopant of opposite dopant polarity than the first dopant.

In Example 15, the subject matter of any of Examples 10 to 14 can optionally include a backside illuminated, BSI, image sensor device or a time-of-flight, ToF, image sensor device or a power semiconductor device.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing a semiconductor device, the method comprising:

providing a semiconductor substrate comprising a high-doped semiconductor substrate layer, a high-doped semiconductor device layer, and a low-doped semiconductor etch stop layer arranged between the high-doped semiconductor substrate layer and the high-doped semiconductor device layer;

removing the high-doped semiconductor substrate layer, wherein the removing comprises dopant selective chemical etching stopping at the low-doped semiconductor etch stop layer; and thinning the low-doped semiconductor etch stop layer to generate an exposed surface of the high-doped semiconductor device layer.

2. The method of claim 1, wherein thinning the low-doped semiconductor etch stop layer comprises chemical mechanical polishing (CMP) or chemical etching.

3. The method of claim 1, wherein removing the high-doped semiconductor substrate layer comprises:

partially removing the high-doped semiconductor substrate layer by grinding;

followed by completely removing the residual high-doped semiconductor substrate layer by the dopant selective chemical etching.

4. The method of claim 1, wherein a total thickness variation (TTV) of the low-doped semiconductor etch stop layer after removing the high-doped semiconductor substrate layer is equal to or less than 1.0 µm.

5. The method of claim 1, wherein the low-doped semiconductor etch stop layer is an epitaxial layer.

6. The method of claim 1, wherein the low-doped semiconductor etch stop layer is doped by a first dopant and counter-doped by a second dopant of opposite dopant polarity than the first dopant.

7. The method of claim 1, wherein a total thickness variation (TTV) of the high-doped semiconductor device layer after thinning the low-doped semiconductor etch stop layer is equal to or less than 1.0 µm.

8. The method of claim 1, wherein the high-doped semiconductor device layer is arranged on a low-doped semiconductor device layer, and wherein the low-doped semiconductor device layer and the high-doped semiconductor device layer have a total thickness of equal to or less than 15 µm, or 10 µm, or 5 µm, or 3 µm, or 2 µm.

9. The method of claim 1, further comprising:

patterning the low-doped semiconductor etch stop layer to generate alignment features which are configured to appear as visible alignment marks in or on the exposed surface of the high-doped semiconductor device layer after thinning.

10. The method of claim 1, wherein the semiconductor substrate further comprises a low-doped semiconductor device layer arranged between the high-doped semiconductor device layer and a functional layer stack.

11. The method of claim 1, wherein the semiconductor substrate further comprises a functional layer stack arranged on the high-doped semiconductor device layer.

12. The method of claim 11, wherein the functional layer stack includes a wafer bonding layer having a thickness between 50 nm and 200 nm.

* * * * *